United States Patent [19]

Inoue

[11] Patent Number: 5,780,361
[45] Date of Patent: Jul. 14, 1998

[54] SALICIDE PROCESS FOR SELECTIVELY FORMING A MONOCOBALT DISILICIDE FILM ON A SILICON REGION

[75] Inventor: Ken Inoue, Tokyo, Japan

[73] Assignee: NEC Corporation, Tokyo, Japan

[21] Appl. No.: 667,647

[22] Filed: Jun. 21, 1996

[30] Foreign Application Priority Data

Jun. 23, 1995 [JP] Japan ................................. 7-180755

[51] Int. Cl.$^6$ ..................................... H01L 21/44
[52] U.S. Cl. ..................... 438/683; 438/586; 438/660
[58] Field of Search ...................... 437/200, 247

[56] References Cited

U.S. PATENT DOCUMENTS

| 4,554,045 | 11/1985 | Bean et al. | 437/189 |
|---|---|---|---|
| 4,814,294 | 3/1989 | West et al. | 437/200 |
| 4,908,331 | 3/1990 | Raaijmakers | 437/200 |
| 5,086,017 | 2/1992 | Lu | 437/200 |
| 5,536,676 | 7/1996 | Cheng et al. | 437/200 |

OTHER PUBLICATIONS

Appelbaum et al., "Study of cobalt–disilicide formation from cobalt monosilicide", J. Appl. Phys., vol. 57, No. 6, pp. 1880–1886, Mar. 15, 1985.

Chevallier et al., "Epitaxial nickel and cobalt silicide formation by rapid thermal annealing", Applied Physics A, vol. 39, pp. 141–145, Feb. 1, 1986.

Gross et al., "Organometallic chemical vapor deposition of cobalt and formation of cobalt disilicide", J. Vac. Sci. Technol. B, vol. 6, No. 5, 1548–52, Sep. 1, 1988.

Singh, "Two–step annealing or cobalt disilicide formation with lowest sheet resistance", Physica Status Solidi A, vol. 111, No. 2, pp. K191–K193, Feb. 16, 1989.

Kikuchi, "Nickel silicide formation and related Schottky barrier diode characterisitics", vol. 136, No. 4, pp. 1162–1165, Apr. 1, 1989.

DeLaere et al., "On the influence of the surface pretreatment of a Si substrate on cobalt silicide formation", Semicond. Sci. Technol., vol. 5, No. 7, pp. 745–751, Jul. 1, 1990.

Wolf, Silicon Processing for the VLSI Era, vol. 2—Processing Integration, Lattice Press, pp. 144–152, 1990.

Hegde et al., "Nanometer scale imaging of cobalt silicide in air using atomic force microscope and scanning tunneling microscope", Surf. Sci., vol. 261, pp. 1–6, 1992.

Primary Examiner—John Niebling
Assistant Examiner—Kevin F. Turner
Attorney, Agent, or Firm—Young & Thompson

[57] ABSTRACT

An improved salicide process for selectively forming a monocobalt disilicide film on a substrate having a surface including both an insulation region containing silicon and a silicon region comprises the following steps. Cobalt is deposited on the substrate, wherein the substrate is heated up and maintained at a first temperature which is capable of causing cobalt to react only with silicon in the silicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the silicon region except on the insulation region.

61 Claims, 4 Drawing Sheets

- ▲ : Room Temperature Co Sputtering
- ○ : High Temperature Co Sputtering at 450°C (Invention)
- ● : High Temperature Co Sputtering and Annealing in vacuum for 5 min. at 450°C

- ▲ : Room Temperature Co Sputtering
- ○ : High Temperature Co Sputtering at 450°C (Invention)
- ● : High Temperature Co Sputtering and Annealing in vacuum for 5 min. at 450°C

- ▲ : Room Temperature Co Sputtering
- ○ : High Temperature Co Sputtering at 450°C (Invention)
- ● : High Temperature Co Sputtering and Annealing in vacuum for 5 min. at 450°C

- ▲ : Room Temperature Co Sputtering
- ○ : High Temperature Co Sputtering at 450°C (Invention)
- ● : High Temperature Co Sputtering and Annealing in vacuum for 5 min. at 450°C

5,780,361

1

SALICIDE PROCESS FOR SELECTIVELY FORMING A MONOCOBALT DISILICIDE FILM ON A SILICON REGION

BACKGROUND OF THE INVENTION

The invention relates to an improved salicide process for selectively forming a monocobalt disilicide film on a silicon or polysilicon region except on a silicon oxide or silicon nitride region as well as an improved salicide process for selectively forming a mononickel monosilicide film on a silicon or polysilicon region except on a silicon oxide or silicon nitride region.

It has been known to utilize a salicide process in fabricating a semiconductor device. One of the conventional processes utilizing the salicide process is disclosed in the Japanese laid-open patent application No. 2-45923. This fabrication process will be described in detail with reference to FIGS. 1A through 1C.

With reference to FIG. 1A, a p-type silicon substrate 401 is prepared. An n-type well region 402 is selectively formed in the p-type silicon substrate 401 in the manner as already known in the art. Field oxide films 403 are selectively formed on the p-type silicon substrate 401 having the n-type well region 402 by a local oxidation of silicon method. The field oxide films 403 selectively formed encompass or define active regions. Thin silicon oxide films are formed on the active region and a polysilicon film is then entirely formed, which covers the thin silicon oxide film and the field oxide film 403. The polysilicon film is doped with phosphorus in the manner known in the art in order to reduce the resistivity of the polysilicon film. The polysilicon film is then patterned by a photolithography and a dry etching to thereby form a gate electrode 405.

A lightly doped n-diffusion layer 413 is formed in an upper region of the p-type silicon substrate 401 by use of a photo-lithography and an ion-implantation where a self-alignment is made by using the gate electrode 405 and the field oxide film 403 as masks. Similarly, a lightly doped p-diffusion layer 414 is formed in an upper region of the n-type well region 402 by use of a photo-lithography and an ion-implantation where a self-alignment is made by using the gate electrode 405 and the field oxide film 403 as masks. Side wall spacers 406 are formed by a chemical vapor deposition and a subsequent etching process at opposite sides of the gate electrodes 405 over the p-type silicon substrate and the n-type well region 402. The side wall spacers 406 may be made of either silicon oxide and silicon nitride.

With reference to FIG. 1B, a heavily doped n-type diffusion layer is formed in an upper region of the lightly doped n-diffusion layer 413 by use of a photo-lithography and an ion-implantation where a self-alignment is made by using the gate electrode 405, the side wall spacers 406 and the field oxide film 403 as masks, whereby n-type source/drain regions 407 having a lightly doped drain structure are formed. Similarly, a heavily doped p-type diffusion layer is formed in an upper region of the lightly doped p-diffusion layer 414 by use of a photo-lithography and an ion-implantation where a self-alignment is made by using the gate electrode 405, the side wall spacers 406 and the field oxide film 403 as masks, whereby p-type source/drain regions 408 having a lightly doped drain structure are formed. A spontaneous oxide film not illustrated is then removed from a surface of the gate electrode 405 made of the phosphorus-doped polysilicon and from a surface of the silicon substrate 401. A cobalt film 411 is deposited on the

2 surfaces of the n-type and p-type source/drain regions 407 and 408 by sputtering in a vacuum chamber at room temperature. Subsequently, the surface of the silicon substrate 401 is first heated at a high temperature, for example, in the range of 500° C. to 800° C. within the vacuum chamber free of exposure to atmosphere so as to cause Co to react with Si not only in the n-type and p-type source/drain regions 407 and 408 but also the field oxide film 403 and the side wall spacers 406 whereby a cobalt silicide film 416 made of $CoSi_2$ is formed on the surface of the silicon substrate 401, for example, not only on the n-type and p-type source/drain regions 407 and 408 but also the silicon oxide film 403 and the side wall spacers 406.

In order to achieve the salicide process or self-alignment process for selectively forming the silicide film, it is required to remove Co from the surfaces of the silicon substrate 401, for example, not only on the n-type and p-type source/drain regions 407 and 408 but also the silicon oxide film 403 and the side wall spacers 406. However, Co on $SiO_2$ has reacted with Si by a heat treatment at a high temperature as described above. Thus, a silicide film is formed not only on the gate electrode 405 of polysilicon and the n-type and p-type source/drain diffusion layers 413 and 414 but also on the silicon dioxide film, for example, the field oxide films 403 and the side wall spacers 406. For which reason, it is difficult to remove the cobalt silicide film by a wet etching unless a liquid containing a mixture of a hydrochloric acid and hydrogen peroxide is used. If the above etchant is used to remove the cobalt silicide film, it is difficult to selectively etch the cobalt silicide film only on the silicon dioxide film. Namely, it is likely that the use of etchant comprising the liquid containing the mixture of a hydrochloric acid and hydrogen peroxide removes and etches the necessary cobalt silicide film not only from the silicon dioxide film, for example, the field oxide films 403 and the side wall spacers 406 but also from the gate electrode 405 of polysilicon and the n-type and p-type source/drain diffusion layers 413 and 414. This undesirable etching reduces the thickness of the necessary cobalt silicide film extending over the gate electrode 405 of polysilicon and the n-type and p-type source/drain diffusion layers 413 and 414. The reduction in thickness of the necessary cobalt silicide film extending over the gate electrode 405 of polysilicon and the n-type and p-type source/drain diffusion layers 413 and 414 results in increase in sheet resistance of the gate and the source/drain. Such increase in sheet resistance of the cobalt silicide films over the gate and the source/drain due to the reduction in thickness of the cobalt silicide film is remarkable when a certain scaling down of the gate and the source/drain is required. Further, the increase in sheet resistance of the cobalt silicide films over the gate and the source/drain due to the reduction in thickness of the silicide film is much more remarkable particularly if the gate and the source/drain are scaled down to not more than 0.1 micrometers. The increase in sheet resistance of the cobalt silicide films over the gate and the source/drain due to the reduction in thickens of the cobalt silicide films by etching the same as well as due to deterioration in thermal resistivity thereof by later heat treatments are serious problems.

In the above circumstances, it had been required to provide a salicide process for selectively forming a silicide film only on a silicon or polysilicon region by preventing Co from reacting with Si on a silicon dioxide region and a silicon nitride region and without etching the silicide film on the silicon or polysilicon region.

SUMMARY OF THE INVENTION

Accordingly, it is an object of the present invention to provide a novel method for selectively forming a monocobalt disilicide film only on a silicon region except on an insulation region containing silicon, free from the above problems and disadvantages as described above.

It is a further object of the present invention to provide a novel method for selectively forming a monocobalt disilicide film having a reduced resistivity only on a silicon region except on an insulation region containing silicon.

It is still a further object of the present invention to provide a novel method for selectively forming a monocobalt disilicide film only on a polysilicon region except on an insulation region containing silicon, free from the above problems and disadvantages as described above.

It is yet a further object of the present invention to provide a novel method for selectively forming a monocobalt disilicide film having a reduced resistivity only on a polysilicon region except on an insulation region containing silicon.

It is furthermore an object of the present invention to provide a novel method for selectively forming a mononickel monosilicide film only on a silicon region except on an insulation region containing silicon, free from the above problems and disadvantages as described above.

It is moreover an object of the present invention to provide a novel method for selectively forming a mononickel monosilicide film having a reduced resistivity only on a silicon region except on an insulation region containing silicon.

It is still moreover an object of the present invention to provide a novel method for selectively forming a mononickel monosilicide film only on a polysilicon region except on an insulation region containing silicon, free from the above problems and disadvantages as described above.

It is moreover an object of the present invention to provide a novel method for selectively forming a mononickel monosilicide film having a reduced resistivity only on a polysilicon region except on an insulation region containing silicon.

It is another object of the present invention to provide a novel method for selectively forming a monocobalt disilicide film only on a polysilicon gate and impurity doped diffusion silicon layers except on any insulation films containing silicon, free from the above problems and disadvantages as described above.

It is still another object of the present invention to provide a novel method for selectively forming a monocobalt disilicide film having a reduced resistivity only on a polysilicon gate and impurity doped diffusion silicon layers except on any insulation films containing silicon.

It is yet another object of the present invention to provide a novel method for selectively forming a mononickel monosilicide film only on a polysilicon gate and impurity doped diffusion silicon layers except on any insulation films containing silicon, free from the above problems and disadvantages as described above.

It is further another object of the present invention to provide a novel method for selectively forming a mononickel monosilicide film having a reduced resistivity only on a polysilicon gate and impurity doped silicon diffusion layers except on any insulation films containing silicon.

The above and other objects, features and advantages of the present invention will be apparent from the following descriptions.

The present invention provides a method for selectively forming a monocobalt disilicide film on a substrate having a surface including both an insulation region containing silicon and a silicon region. The method comprises the following steps. Cobalt is deposited on the substrate, wherein the substrate is heated up and maintained at a first temperature which is capable of causing cobalt to react only with silicon in the silicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the silicon region except on the insulation region.

The present invention also provides another method for selectively forming a monocobalt disilicide film on a substrate having a surface including both an insulation region containing silicon and a polysilicon region. The method comprises the following steps. Cobalt is deposited on the substrate, wherein the substrate is heated up and maintained at a first temperature which is capable of causing cobalt to react only with silicon in the polysilicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the silicon region except on the insulation region.

The present invention also provides still another method for selectively forming a mononickel monosilicide film on a substrate having a surface including both an insulation region containing silicon and a silicon region. The method comprises the following steps. Nickel is deposited on the substrate, wherein the substrate is heated up and maintained at a first temperature which is capable of causing nickel to react only with silicon in the silicon region without reacting with silicon in the insulation region. The substrate is subjected to a vacuum annealing at a temperature equal to or near the first temperature to form a film made of dinickel monosilicide. The substrate is subjected to a heat treatment at a second temperature which is higher than the first temperature and is capable of causing a phase transition from dinickel monosilicide into mononickel monosilicide to thereby form a mononickel monosilicide film on the silicon region except on the insulation region.

The present invention also provides yet another method for selectively forming a monocobalt disilicide film on a substrate having a surface including both an insulation region containing silicon and a polysilicon region. The method comprises the following steps. Cobalt is deposited on the substrate, wherein the substrate is heated up and maintained at a first temperature which is capable of causing cobalt to react only with silicon in the polysilicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the polysilicon region except on the insulation region.

The present invention also provides still another method for selectively forming a mononickel monosilicide film on a substrate having a surface including both an insulation region containing silicon and a polysilicon region. The method comprises the following steps. Nickel is deposited on the substrate, wherein the substrate is heated up and maintained at a first temperature which is capable of causing nickel to react only with silicon in the polysilicon region without reacting with silicon in the insulation region. The substrate is subjected to a vacuum annealing at a temperature equal to or near the first temperature to form a film made of dinickel monosilicide. The substrate is subjected to a heat treatment at a second temperature which is higher than the first temperature and is capable of causing a phase transition from dinickel monosilicide into mononickel monosilicide to thereby form a mononickel monosilicide film on the polysilicon region except on the insulation region.

The present invention also provides yet another method for fabricating a field effect transistor comprising the following steps. Field oxide films are selectively formed on a surface of a silicon substrate to define an active region. A gate oxide film is selectively formed on the active region. A polysilicon film which is doped with an impurity is formed on the gate oxide film. A gate electrode is formed by patterning the polysilicon film. Lightly doped diffusion layers are selectively formed in an upper portion of the silicon substrate, provided the upper portion is not covered by the field oxide film and the gate electrode. Side wall spacers of silicon oxide are formed at opposite sides of the gate electrode. Surfaces of the lightly doped diffusion layers are subjected to an ion-implantation with a self-alignment technique using the field oxide films, the gate electrode and the side wall spacers as masks to thereby form impurity doped diffusion layers in upper regions of the lightly doped diffusion layers. Subsequently the silicon substrate is subjected to a heat treatment to cause recovery of crystal structure of silicon and activation of the impurity doped whereby lightly-doped drain structures of source/drain regions are formed. Spontaneous silicon oxide films are removed from a surface of the gate electrode made of polysilicon and from surfaces of the impurity doped diffusion layers. Cobalt is deposited on the silicon substrate by a sputtering method, wherein the silicon substrate is heated up and maintained at a first temperature in the range of 200° C. to 450° C. to form a cobalt film extending over the field oxide film, the impurity doped diffusion layers, the side wall spacers and the gate electrode. The substrate is subjected to a vacuum annealing at a temperature equal to or near the first temperature to cause cobalt to react only with silicon in the impurity doped diffusion layers and the gate electrode made of polysilicon without reacting with silicon in the field oxide film and the side wall spacers to thereby selectively form a film made of dicobalt monosilicide only on the impurity doped diffusion layers and the gate electrode as well as form a cobalt film on the field oxide film and the side wall spacers. The substrate is subjected to a heat treatment in a nitrogen atmosphere at a second temperature of about 500° C. to cause a phase transition from dicobalt monosilicide into monocobalt monosilicide whereby the dicobalt monosilicide film is made into a monocobalt monosilicide film. The surface of the substrate is subjected to a wet etching to selectively remove only the cobalt film from the field oxide film and the side wall spacers cobalt so that the field oxide film and the side wall spacers are shown whilst the impurity doped diffusion layers and the gate electrode remain covered by the film made of monocobalt monosilicide. The substrate is subjected to a heat treatment at a third temperature of not less than 650° C. to cause a phase transition from monocobalt monosilicide into monocobalt disilicide whereby the monocobalt monosilicide film is made into a monocobalt disilicide film.

The present invention also provides further another method for fabricating a field effect transistor comprising the following steps. Field oxide films are selectively on a surface of a silicon substrate to define an active region. A gate oxide film is selectively on the active region. A polysilicon film which is doped with an impurity is formed on the gate oxide film. A gate electrode is formed by patterning the polysilicon film. Lightly doped diffusion layers are selectively formed in an upper portion of the silicon substrate, provided the upper portion is not covered by the field oxide film and the gate electrode. Side wall spacers of silicon oxide are selectively formed at opposite sides of the gate electrode. Surfaces of the lightly doped diffusion layers are subjected to an ion-implantation with a self-alignment technique using the field oxide films, the gate electrode and the side wall spacers as masks to form impurity doped diffusion layers in upper regions of the lightly doped diffusion layers. The silicon substrate is subjected to a heat treatment to cause recovery of crystal structure of silicon and activation of the impurity doped whereby lightly-doped drain structures of source/drain regions are formed. Spontaneous silicon oxide films are removed from a surface of the gate electrode made of polysilicon and from surfaces of the impurity doped diffusion layers. Nickel is deposited on the silicon substrate by a sputtering method, wherein the silicon substrate is heated up and maintained at a first temperature in the range of 150° C. to 300° C. to form a nickel film extending over the field oxide film, the impurity doped diffusion layers, the side wall spacers and the gate electrode. The substrate is subjected to a vacuum annealing at a temperature equal to or near the first temperature to cause nickel to react only with silicon in the impurity doped diffusion layers and the gate electrode made of polysilicon without reacting with silicon in the field oxide film and the side wall spacers to thereby selectively form a film made of dinickel monosilicide only on the impurity doped diffusion layers and the gate electrode as well as form a nickel film on the field oxide film and the side wall spacers. The surface of the substrate is subjected to a wet etching to selectively remove only the nickel film from the field oxide film and the side wall spacers nickel so that the field oxide film and the side wall spacers are shown whilst the impurity doped diffusion layers and the gate electrode remain covered by the film made of dinickel monosilicide. The substrate is subjected to a heat treatment at a second temperature of about 450° C. to cause a phase transition from dinickel monosilicide into mononickel monosilicide whereby the dinickel monosilicide film is made into a mononickel monosilicide film.

BRIEF DESCRIPTIONS OF THE DRAWINGS

Preferred embodiments of the present invention will be described in detail with reference to the accompanying drawings.

DISCLOSURE OF THE INVENTION

Figure 1A:
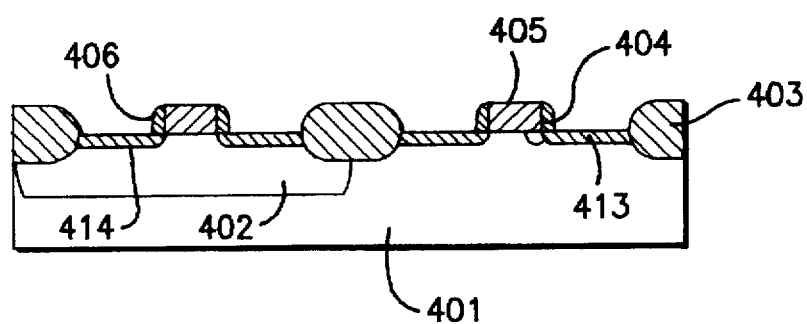
FIGS. 1A through 1C are fragmentary cross sectional elevation views illustrative of the conventional method for fabricating a field effect transistor in prior art.
Figure 1B:
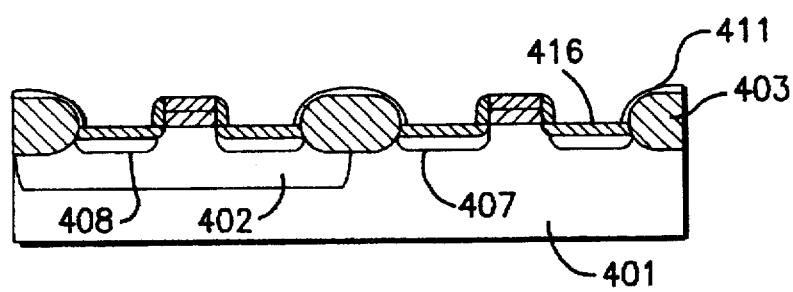
Figure 1C:
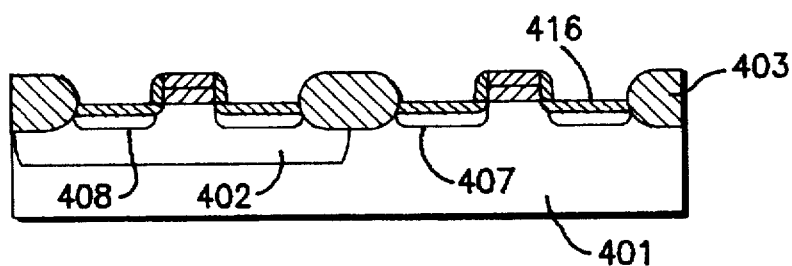

The present invention provides a method for selectively forming a monocobalt disilicide film on a substrate having a surface including both an insulation region containing silicon and a silicon region. The method comprises the following steps. Cobalt is deposited on the substrate, wherein the substrate is heated up and maintained at a first temperature which is capable of causing cobalt to react only with silicon in the silicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the silicon region except on the insulation region.

It is preferable that the first temperature is in the range of 200° C. through 500° C. It is more preferable that the first temperature is a temperature at which cobalt is initiated to react with silicon. It is furthermore preferable that the temperature is in the range of 350° C. through 400° C.

It is also preferable that the second temperature is in the range of 500° C. through 800° C. It is more preferable that the second temperature is 800° C. at which the substrate is subjected to a RTA process.

It is optionally preferable that following the second step and provided the film is made of dicobalt monosilicide, the substrate is subjected to an additional heat treatment in a nitrogen atmosphere at a third temperature which is higher than the first temperature and lower than the second temperature to cause a phase transition from dicobalt monosilicide into monocobalt monosilicide whereby the dicobalt monosilicide film is made into a monocobalt monosilicide film.

It is also optionally preferable that the third temperature is about 500° C. at which the substrate is subjected to a RTA process.

It is also optionally preferable that prior to the final step, the surface of the substrate is subjected to a wet etching to selectively remove only cobalt unreacted with silicon so that the insulation region is shown whilst the silicon region remains covered by the film made of one selected from the group consisting of dicobalt monosilicide and monocobalt monosilicide. In this case, the wet etching may be made by using a liquid as an etchant containing a mixture of sulfuric acid and hydrogen peroxide.

It is advantageously preferable that following the second step and provided the film is made of dicobalt monosilicide, the substrate is subjected to an additional heat treatment in a nitrogen atmosphere at third temperature which is higher than the first temperature and lower than the second temperature to cause a phase transition from dicobalt monosilicide into monocobalt monosilicide whereby the dicobalt monosilicide film is made into a monocobalt monosilicide film, and thereafter the surface of the substrate is subjected to a wet etching to selectively remove only cobalt unreacted with silicon so that the insulation region is shown whilst the silicon region remains covered by the film made of one selected from the group consisting of dicobalt monosilicide and monocobalt monosilicide. It is preferable that the third temperature is about 500° C. at which temperature the substrate is subjected to a RTA process. In this case, the wet etching may be made by using a liquid as an etchant containing a mixture of sulfuric acid and hydrogen peroxide.

The monocobalt disilicide film has grains whose size is not larger than 0.1 micrometers which prove that the monocobalt disilicide film has a lower resistivity.

It is preferable that the insulation region may comprise either a silicon oxide region or a silicon nitride region.

It is further preferable that cobalt is deposited on the substrate by a sputtering method.

If cobalt is deposited on the substrate at a high temperature which is capable of causing a phase transition from monocobalt monosilicide to monocobalt disilicide, cobalt deposited on the insulation region reacts with silicon contained in the insulation region. Once cobalt has reacted with silicon in the insulation region, it is difficult to remove cobalt by using the wet etching without etching the dicobalt monosilicide film or the monocobalt disilicide film over the silicon region. If the dicobalt monosilicide film or the monocobalt monosilicide film is etched by the wet etching having been made for the purpose of removing cobalt deposited on the insulation region and reacted with silicon in the insulation region, then the thickness of the dicobalt monosilicide film or the monocobalt monosilicide film is reduced. Even if the heat treatment is made to the substrate to cause a phase transition from dicobalt monosilicide or monocobalt monosilicide into monocobalt disilicide, the reduced thickness of the monocobalt disilicide film increases the sheet resistance. Such increase in sheet resistance of the monocobalt disilicide film is more remarkable if the silicon region is scaled down to not larger than 0.1 micrometers.

By contrast, according to the present invention, cobalt is deposited on the substrate at a temperature, for example, in the range of 200° C. to 500° C. to cause cobalt to react only with silicon in the silicon region without reacting with silicon in the insulation region. Subsequently, the vacuum annealing is made to form a dicobalt monosilicide film or a monocobalt monosilicide film. Further, a heat treatment is made to cause a phase transition from dicobalt monosilicide or monocobalt monosilicide to monocobalt disilicide whereby the dicobalt monosilicide film or the monocobalt monosilicide film is made into a monocobalt disilicide film.

In accordance with the above salicide processes, it is possible to selectively form the monocobalt disilicide film only on the silicon region without causing any reaction of cobalt with silicon in the insulation region.

The above dicobalt monosilicide or monocobalt monosilicide film once formed has uniform grains and small in size. If cobalt is deposited on the substrate at a temperature at which cobalt begins to react with silicon and subsequently subjected to a vacuum annealing at the same temperature, then grain cores are formed uniformly at a highest density in the dicobalt monosilicide film. This means the average distance between the grain cores are extremely close to each other. Since the grains can increase in size by a heat treatment until the grains are in contact with adjacent grains, the grains can not grow up largely. As a result, extremely small and uniform grains are formed in the dicobalt monosilicide film. According to the above preset invention, the grain size is not larger than 0.1 micrometers. Such extremely small and uniform grains remarkably reduces the resisitvity of the monocobalt disilicide film.

By contrast, if the heat treatment is made one time at a high temperature, for example, about 700° C., the reaction of cobalt with silicon in the silicon region is not uniformly caused whereby the grains largely vary in size and less extremely small grain is formed.

In order to obtain a remarkable reduction in sheet resistance of the monocobalt disilicide film, it is essential to reduce the size of grains in the monocobalt disilicide film since if the size of the silicon region on which the monocobalt disilicide is selectively formed is scaled down near to the grain size, it is likely that one grain extends over the silicon region. This remarkably increases the sheet resistance of the monocobalt disilicide film.

Further, there is a possibility of causing a cohesion of monocobalt disilicide by a later heat treatment, resulting in an increase in sheet resistance of the monocobalt disilicide film. In this case, if the grain size is large, the increase in sheet resistance of the monocobalt disilicide film is remarkable.

Cobalt can react with silicon in the silicon region at a lower temperature than it can react with silicon in the insulation region made of silicon oxide or silicon nitride. By utilizing this fact, cobalt is deposited on the substrate at a temperature which is capable of causing cobalt to react with silicon in the silicon region without, however, reacting with silicon in the insulation region made of silicon oxide or silicon nitride. It is easy to remove by a wet etching unreacted cobalt from the surface of the insulation region made of silicon oxide or silicon nitride. This makes it possible to avoid any etching to the dicobalt monosilicide film or the monocobalt monosilicide film.

The present invention also provides another method for selectively forming a monocobalt disilicide film on a substrate having a surface including both an insulation region containing silicon and a polysilicon region. The method comprises the following steps. Cobalt is deposited on the substrate, wherein the substrate is heated up and maintained at a first temperature which is capable of causing cobalt to react only with silicon in the polysilicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the polysilicon region except on the insulation region.

It is preferable that the first temperature is in the range of 200° C. through 500° C. It is more preferable that the first temperature is a temperature at which cobalt begins to react with silicon. It is furthermore preferable that the temperature is in the range of 350° C. through 400° C.

It is preferable that the second temperature is in the range of 500° C. through 800° C. It is more preferable that the second temperature is 800° C. at which the substrate is subjected to a RTA process.

It is optionally preferable that following to the second step and provided the film is made of dicobalt monosilicide, the substrate is subjected to an additional heat treatment in a nitrogen atmosphere at a third temperature which is higher than the first temperature and lower than the second temperature to cause a phase transition from dicobalt monosilicide into monocobalt monosilicide whereby the dicobalt monosilicide film is made into a monocobalt monosilicide film.

It is also optionally preferable that the third temperature is about 500° C. at which the substrate is subjected to a RTA process.

It is also optionally preferable that prior to the final step, the surface of the substrate is subjected to a wet etching to selectively remove only cobalt unreacted with silicon so that the insulation region is shown whilst the polysilicon region remains covered by the film made of one selected from the group consisting of dicobalt monosilicide and monocobalt monosilicide. In this case, the wet etching may be made by using a liquid as an etchant containing a mixture of sulfuric acid and hydrogen peroxide.

It is advantageously preferable that following the second step and provided the film is made of dicobalt monosilicide, the substrate is subjected to an additional heat treatment in a nitrogen atmosphere at a third temperature which is higher than the first temperature and lower than the second temperature to cause a phase transition from dicobalt monosilicide into monocobalt monosilicide whereby the dicobalt monosilicide film is made into a monocobalt monosilicide film, and thereafter the surface of the substrate is subjected to a wet etching to selectively remove only cobalt unreacted with silicon so that the insulation region is shown whilst the polysilicon region remains covered by the film made of one selected from the group consisting of dicobalt monosilicide and monocobalt monosilicide. It is preferable that the third temperature is about 500° C. at which temperature the substrate is subjected to a RTA process. In this case, the wet etching may be made by using a liquid as an etchant containing a mixture of sulfuric acid and hydrogen peroxide.

The monocobalt disilicide film has grains whose size is not larger than 0.1 micrometers which prove that the monocobalt disilicide film has a lower resistivity.

It is conceivable that the insulation region may comprise either a silicon oxide region or a silicon nitride region.

It is further preferable that cobalt is deposited on the substrate by a sputtering method.

If cobalt is deposited on the substrate at a high temperature which is capable of causing a phase transition from monocobalt monosilicide to monocobalt disilicide, cobalt deposited on the insulation region reacts with silicon contained in the insulation region. Once cobalt has reacted with silicon in the insulation region, it is difficult to remove cobalt by using the wet etching without etching the dicobalt monosilicide film or the monocobalt disilicide film over the polysilicon region. If the dicobalt monosilicide film or the monocobalt monosilicide film is etched by the wet etching having been made for the purpose of removing cobalt deposited on the insulation region and reacted with silicon in the insulation region, then the thickness of the dicobalt monosilicide film or the monocobalt monosilicide film is reduced. Even if the heat treatment is made to the substrate to cause a phase transition from dicobalt monosilicide or monocobalt monosilicide into monocobalt disilicide, the reduced thickness of the monocobalt disilicide film increases the sheet resistance. Such increase in sheet resistance of the monocobalt disilicide film is more remarkable if the polysilicon region is scaled down to not larger than 0.1 micrometers.

By contrast, according to the present invention, cobalt is deposited on the substrate at a temperature, for example, in the range of 200° C. to 500° C. to cause cobalt to react only with silicon in the polysilicon region without reacting with silicon in the insulation region. Subsequently, the vacuum annealing is made to form a dicobalt monosilicide film or a monocobalt monosilicide film. Further, a heat treatment is made to cause a phase transition from dicobalt monosilicide or monocobalt monosilicide to monocobalt disilicide whereby the dicobalt monosilicide film or the monocobalt monosilicide film is made into a monocobalt disilicide film.

In accordance with the above salicide processes, it is possible to selectively form the monocobalt disilicide film only on the polysilicon region without causing any reaction of cobalt with silicon in the insulation region.

The above dicobalt monosilicide or monocobalt monosilicide film once formed has uniform grains and small in size. If cobalt is deposited on the substrate at a temperature at which cobalt is initiated to react with silicon and subsequently subjected to a vacuum annealing at the same temperature, then grain cores are formed uniformly at a highest density in the dicobalt monosilicide film. This means the average distance between the grain cores are extremely close to each other. Since the grains can increase in size by a heat treatment until the grains are in contact with adjacent grains, the grains can not grow up largely. As a result, extremely small and uniform grains are formed in the dicobalt monosilicide film. According to the above preset invention, the grain size is not larger than 0.1 micrometers. Such extremely small and uniform grains remarkably reduces the resisitvity of the monocobalt disilicide film.

By contrast, if the heat treatment is made one time at a high temperature, for example, about 700° C., the reaction of cobalt with silicon in the polysilicon region is not uniformly caused whereby the grains largely vary in size and less extremely small grain is formed.

In order to obtain a remarkable reduction in sheet resistance of the monocobalt disilicide film, it is essential to reduce the size of grains in the monocobalt disilicide film since if the size of the polysilicon region on which the monocobalt disilicide is selectively formed is scaled down near to the grain size, it is likely that one grain extends over the polysilicon region. This remarkably increases the sheet resistance of the monocobalt disilicide film.

Further, there is a possibility of causing a cohesion of monocobalt disilicide by a later heat treatment, resulting in an increase in sheet resistance of the monocobalt disilicide film. In this case, if the grain size is large, the increase in sheet resistance of the monocobalt disilicide film is remarkable.

Cobalt can react with silicon in the polysilicon region at a lower temperature than it can react with silicon in the insulation region made of silicon oxide or silicon nitride. By utilizing this fact, cobalt is deposited on the substrate at a temperature which is capable of causing cobalt react with silicon in the polysilicon region without, however, reacting with silicon in the insulation region made of silicon oxide or silicon nitride. It is easy to remove by a wet etching unreacted cobalt from the surface of the insulation region made of silicon oxide or silicon nitride. This makes it possible to avoid any etching to the dicobalt monosilicide film or the monocobalt monosilicide film.

The present invention also provides still another method for selectively forming a mononickel monosilicide film on a substrate having a surface including both an insulation region containing silicon and a silicon region. The method comprises the following steps. Nickel is deposited on the substrate, wherein the substrate is heated up and maintained at a first temperature which is capable of causing nickel to react only with silicon in the silicon region without reacting with silicon in the insulation region. The substrate is subjected to a vacuum annealing at a temperature equal to or near the first temperature to form a film made of dinickel monosilicide. The substrate is subjected to a heat treatment at a second temperature which is higher than the first temperature and is capable of causing a phase transition from dinickel monosilicide into mononickel monosilicide to thereby form a mononickel monosilicide film on the silicon region except on the insulation region.

It is preferable that the first temperature is in the range of 150° C. through 300° C. It is more preferable that the first temperature is a temperature at which nickel is initiated to react with silicon. It is furthermore preferable that the temperature is 200° C.

It is also preferable that the second temperature is 450° C. It is more preferable that the substrate is subjected to a RTA process.

It is optionally preferable that prior to the final step, the surface of the substrate is subjected to a wet etching to selectively remove only nickel unreacted with silicon so that the insulation region is shown whilst the silicon region remains covered by the film made of dinickel monosilicide. In this case, the wet etching may be made by using a liquid as an etchant containing a mixture of sulfuric acid and hydrogen peroxide.

It is preferable that the insulation region may comprise either a silicon oxide region or a silicon nitride region.

It is preferable that nickel is deposited on the substrate by a sputtering method.

The present invention also provides yet another method for selectively forming a monocobalt disilicide film on a substrate having a surface including both an insulation region containing silicon and a polysilicon region. The method comprises the following steps. Cobalt is deposited on the substrate, wherein the substrate is heated up and maintained at a first temperature which is capable of causing cobalt to react only with silicon in the polysilicon region without reacting with silicon in the insulation region. The substrate is subjected to a vacuum annealing at a temperature equal to or near the first temperature to form a film made of one selected from the group consisting of dicobalt monosilicide and monocobalt monosilicide. The substrate is subjected to a heat treatment at a second temperature which is higher than the first temperature and is capable of causing a phase transition from dicobalt monosilicide or monocobalt monosilicide into monocobalt disilicide to thereby form a monocobalt disilicide film on the polysilicon region except on the insulation region.

It is preferable that the first temperature is in the range of 200° C. through 500° C. It is more preferable that the first temperature is a temperature at which cobalt begins to react with silicon. It is furthermore preferable that the temperature is in the range of 350° C. through 400° C.

It is preferable that the second temperature is in the range of 500° C. through 800° C. It is more preferable that the second temperature is 800° C. at which the substrate is subjected to a RTA process.

It is optionally available that following the second step and provided the film is made of dicobalt monosilicide, the substrate is subjected to an additional heat treatment in a nitrogen atmosphere at a third temperature which is higher than the first temperature and lower than the second temperature to cause a phase transition from dicobalt monosilicide into monocobalt monosilicide whereby the dicobalt monosilicide film is made into a monocobalt monosilicide film.

It is also optionally preferable that the third temperature is about 500° C. at which the substrate is subjected to a RTA process.

It is also optionally preferable that prior to the final step, the surface of the substrate is subjected to a wet etching to selectively remove only cobalt unreacted with silicon so that the insulation region is shown whilst the polysilicon region remains covered by the film made of one selected from the group consisting of dicobalt monosilicide and monocobalt monosilicide. In this case, the wet etching may be made by using a liquid as an etchant containing a mixture of sulfuric acid and hydrogen peroxide.

It is advantageously preferable that following the second step and provided the film is made of dicobalt monosilicide, the substrate is subjected to an additional heat treatment in a nitrogen atmosphere at a third temperature which is higher than the first temperature and lower than the second temperature to cause a phase transition from dicobalt monosilicide into monocobalt monosilicide whereby the dicobalt monosilicide film is made into a monocobalt monosilicide film, and thereafter the surface of the substrate is subjected to a wet etching to selectively remove only cobalt unreacted with silicon so that the insulation region is shown whilst the polysilicon region remains covered by the film made of one selected from the group consisting of dicobalt monosilicide and monocobalt monosilicide. It is preferable that the third temperature is about 500° C. at which temperature, the substrate is subjected to a RTA process. In this case, the wet etching may be made by using a liquid as an etchant containing a mixture of sulfuric acid and hydrogen peroxide.

The monocobalt disilicide film has grains whose size is not larger than 0.1 micrometers which prove that the monocobalt disilicide film has a lower resistivity.

It is preferable that the insulation region may comprise either a silicon oxide region or a silicon nitride region.

It is further preferable that cobalt is deposited on the substrate by a sputtering method.

If nickel is deposited on the substrate at a high temperature which is capable of causing a phase transition from dinickel monosilicide to mononickel monosilicide, nickel deposited on the insulation region reacts with silicon contained in the insulation region. Once nickel has reacted with silicon in the insulation region, it is difficult to remove nickel by using the wet etching without etching the dinickel monosilicide film over the silicon region. If the dinickel monosilicide film is etched by the wet etching having been made for the purpose of removing nickel deposited on the insulation region and reacted with silicon in the insulation region, then the thickness of the dinickel monosilicide film is reduced. Even if the heat treatment is made to the substrate to cause a phase transition from dinickel monosilicide into mononickel monosilicide, the reduced thickness of the mononickel monosilicide film increases the sheet resistance. Such increase in sheet resistance of the mononickel monosilicide film is more remarkable if the silicon region is scaled down to not larger than 0.1 micrometers.

By contrast, according to the present invention, nickel is deposited on the substrate at a temperature, for example, in the range of 200° C. to 500° C. to cause nickel to react only with silicon in the silicon region without reacting with silicon in the insulation region. Subsequently, the vacuum annealing is made to form a dinickel monosilicide film. Further, a heat treatment is made to cause a phase transition from dinickel monosilicide to mononickel monosilicide whereby the dinickel monosilicide film is made into a mononickel monosilicide film.

In accordance with the above salicide processes, it is possible to selectively form the mononickel monosilicide film only on the silicon region without causing any reaction of nickel with silicon in the insulation region.

The above dinickel monosilicide once formed has uniform grains and small in size. If nickel is deposited on the substrate at a temperature at which nickel begins to react with silicon and subsequently subjected to a vacuum annealing at the same temperature, then grain cores are formed uniformly at a highest density in the dinickel monosilicide film. This means the average distances between the grain cores are extremely close to each other. Since the grains can increase in size by a heat treatment until the grains are in contact with adjacent grains, the grains can not grow up largely. As a result, extremely small and uniform grains are formed in the dinickel monosilicide film. According to the above preset invention, the grain size is not larger than 0.1 micrometers. Such extremely small and uniform grains remarkably reduces the resisitvity of the mononickel monosilicide film.

By contrast, if the heat treatment is made one time at a high temperature, the reaction of nickel with silicon in the silicon region is not uniformly caused whereby the grains largely vary in size and less extremely small grain is formed.

In order to obtain a remarkable reduction in sheet resistance of the mononickel monosilicide film, it is essential to reduce the size of grains in the mononickel monosilicide film since if the size of the silicon region on which the mononickel monosilicide is selectively formed is scaled down near to the grain size, it is likely that one grain extends over the silicon region. This remarkably increases the sheet resistance of the mononickel monosilicide film.

Further, there is a possibility of causing a cohesion of mononickel monosilicide by a later heat treatment, resulting in an increase in sheet resistance of the mononickel monosilicide film. In this case, if the grain size is large, the increase in sheet resistance of the mononickel monosilicide film is remarkable.

Nickel can react with silicon in the silicon region at a lower temperature than nickel can react with silicon in the insulation region made of silicon oxide or silicon nitride. By utilizing this fact, nickel is deposited on the substrate at a temperature which is capable of causing nickel to react with silicon in the silicon region without, however, reacting with silicon in the insulation region made of silicon oxide or silicon nitride. It is easy to remove by a wet etching unreacted nickel from the surface of the insulation region made of silicon oxide or silicon nitride. This makes it possible to avoid any etching to the dinickel monosilicide film.

The present invention also provides still another method for selectively forming a mononickel monosilicide film on a substrate having a surface including both an insulation region containing silicon and a polysilicon region. The method comprises the following steps. Nickel is deposited on the substrate, wherein the substrate is heated up and maintained at a first temperature which is capable of causing nickel to react only with silicon in the polysilicon region without reacting with silicon in the insulation region. The substrate is subjected to a vacuum annealing at a temperature equal to or near the first temperature to form a film made of dinickel monosilicide. The substrate is subjected to a heat treatment at a second temperature which is higher than the first temperature and is capable of causing a phase transition from dinickel monosilicide into mononickel monosilicide to thereby form a mononickel monosilicide film on the polysilicon region except on the insulation region.

It is preferable that the first temperature is in the range of 150° C. through 300° C. It is more preferable that the first temperature is a temperature at which nickel is initiated to react with silicon. It is furthermore preferable that the temperature is 200° C.

It is also preferable that the second temperature is 450° C. It is more preferable that the substrate is subjected to a RTA process.

It is optionally preferable that prior to the final step, the surface of the substrate is subjected to a wet etching to selectively remove only nickel unreacted with silicon so that the insulation region is shown whilst the polysilicon region remains covered by the film made of dinickel monosilicide. In this case, the wet etching may be made by using a liquid as an etchant containing a mixture of sulfuric acid and hydrogen peroxide.

It is conceivable that the insulation region may comprise either a silicon oxide region or a silicon nitride region.

It is preferable that nickel is deposited on the substrate by a sputtering method.

If nickel is deposited on the substrate at a high temperature which is capable of causing a phase transition from dinickel monosilicide to mononickel monosilicide, nickel deposited on the insulation region reacts with silicon contained in the insulation region. Once nickel has reacted with silicon in the insulation region, it is difficult to remove nickel by using the wet etching without etching the dinickel monosilicide film over the polysilicon region. If the dinickel monosilicide film is etched by the wet etching having been made for the purpose of removing nickel deposited on the insulation region and reacted with silicon in the insulation region, then the thickness of the dinickel monosilicide film is reduced. Even if the heat treatment is made to the substrate to cause a phase transition from dinickel monosilicide into mononickel monosilicide, the reduced thickness of the mononickel monosilicide film increases the sheet resistance. Such increase in sheet resistance of the mononickel monosilicide film is more remarkable if the polysilicon region is scaled down to not larger than 0.1 micrometers.

By contrast, according to the present invention, nickel is deposited on the substrate at a temperature, for example, in the range of 200° C. to 500° C. to cause nickel to react only with silicon in the polysilicon region without reacting with silicon in the insulation region. Subsequently, the vacuum annealing is made to form a dinickel monosilicide film. Further, a heat treatment is made to cause a phase transition from dinickel monosilicide to mononickel monosilicide whereby the dinickel monosilicide film is made into a mononickel monosilicide film.

In accordance with the above salicide processes, it is possible to selectively form the mononickel monosilicide film only on the polysilicon region without causing any reaction of nickel with silicon in the insulation region.

The above dinickel monosilicide once formed has uniform grains and small in size. If nickel is deposited on the substrate at a temperature at which nickel begins to react with silicon and subsequently subjected to a vacuum annealing at the same temperature, then grain cores are formed uniformly at a highest density in the dinickel monosilicide film. This means the average distance between the grain cores are extremely close to each other. Since the grains can increase in size by a heat treatment until the grains are in contact with adjacent grains, the grains can not grow up largely. As a result, extremely small and uniform grains are formed in the dinickel monosilicide film. According to the above preset invention, the grain size is not larger than 0.1 micrometers. Such extremely small and uniform grains remarkably reduces the resisitvity of the mononickel monosilicide film.

By contrast, if the heat treatment is made one time at a high temperature, the reaction of nickel with silicon in the polysilicon region is not uniformly caused whereby the grains largely vary in size and less extremely small grain is formed.

In order to obtain a remarkable reduction in sheet resistance of the mononickel monosilicide film, it is essential to reduce the size of grains in the mononickel monosilicide film since if the size of the polysilicon region on which the mononickel monosilicide is selectively formed is scaled down near to the grain size, it is likely that one grain extends over the polysilicon region. This remarkably increases the sheet resistance of the mononickel monosilicide film.

Further, there is a possibility of causing a cohesion of mononickel monosilicide by a later heat treatment, resulting in an increase in sheet resistance of the mononickel monosilicide film. In this case, if the grain size is large, the increase in sheet resistance of the mononickel monosilicide film is remarkable.

Nickel can react with silicon in the polysilicon region at a lower temperature than nickel can react with silicon in the insulation region made of silicon oxide or silicon nitride. By utilizing this fact, nickel is deposited on the substrate at a temperature which is capable of causing nickel to react with silicon in the polysilicon region without, however, reacting with silicon in the insulation region made of silicon oxide or silicon nitride. It is easy to remove by a wet etching unreacted nickel from the surface of the insulation region made of silicon oxide or silicon nitride. This makes it possible to avoid any etching to the dinickel monosilicide film.

The present invention also provides yet another method for fabricating a field effect transistor comprising the following steps. Field oxide films are selectively formed on a surface of a silicon substrate to define an active region. A gate oxide film is selectively formed on the active region. A polysilicon film which is doped with an impurity is formed on the gate oxide film. A gate electrode is formed by patterning the polysilicon film. Lightly doped diffusion layers are selectively formed in an upper portion of the silicon substrate, provided the upper portion is not covered by the field oxide film and the gate electrode. Side wall spacers of silicon oxide are formed at opposite sides of the gate electrode. Surfaces of the lightly doped diffusion layers are subjected to an ion-implantation with a self-alignment technique using the field oxide films, the gate electrode and the side wall spacers as masks to thereby form impurity doped diffusion layers in upper regions of the lightly doped diffusion layers. Subsequently the silicon substrate is subjected to a heat treatment to cause recovery of crystal structure of silicon and activation of the impurity doped whereby lightly-doped drain structures of source/drain regions are formed. Spontaneous silicon oxide films are removed from a surface of the gate electrode made of polysilicon and from surfaces of the impurity doped diffusion layers. Cobalt is deposited on the silicon substrate by a sputtering method, wherein the silicon substrate is heated up and maintained at a first temperature in the range of 200° C. to 450° C. to form a cobalt film extending over the field oxide film, the impurity doped diffusion layers, the side wall spacers and the gate electrode. The substrate is subjected to a vacuum annealing at a temperature equal to or near the first temperature to cause cobalt to react only with silicon in the impurity doped diffusion layers and the gate electrode made of polysilicon without reacting with silicon in the field oxide film and the side wall spacers to thereby selectively form a film made of dicobalt monosilicide only on the impurity doped diffusion layers and the gate electrode as well as form a cobalt film on the field oxide film and the side wall spacers. The substrate is subjected to a heat treatment in a nitrogen atmosphere at a second temperature of about 500° C. to cause a phase transition from dicobalt monosilicide into monocobalt monosilicide whereby the dicobalt monosilicide film is made into a monocobalt monosilicide film. The surface of the substrate is subjected to a wet etching to selectively remove only the cobalt film from the field oxide film and the side wall spacers cobalt so that the field oxide film and the side wall spacers are shown whilst the impurity doped diffusion layers and the gate electrode remain covered by the film made of monocobalt monosilicide. The substrate is subjected to a heat treatment at a third temperature of not less than 650° C. to cause a phase transition from monocobalt monosilicide into monocobalt disilicide whereby the monocobalt monosilicide film is made into a monocobalt disilicide film.

It is preferable that the first temperature is 450° C. It is also preferable that the third temperature is 800° C. at which the substrate is subjected to a RTA process. It is also preferable that the second temperature is about 500° C. at which the substrate is subjected to a RTA process.

It is optionally preferable that the wet etching uses a liquid as an etchant containing a mixture of sulfuric acid and hydrogen peroxide.

The present invention also provides further another method for fabricating a field effect transistor comprising the following steps. Field oxide films are selectively formed on a surface of a silicon substrate to define an active region. A gate oxide film is selectively formed on the active region. A polysilicon film which is doped with an impurity is formed on the gate oxide film. A gate electrode is formed by patterning the polysilicon film. Lightly doped diffusion layers are selectively formed in an upper portion of the silicon substrate, provided the upper portion is not covered by the field oxide film and the gate electrode. Side wall spacers of silicon oxide are selectively formed at opposite sides of the gate electrode. Surfaces of the lightly doped diffusion layers are subjected to an ion-implantation with a self-alignment technique using the field oxide films, the gate electrode and the side wall spacers as masks to form impurity doped diffusion layers in upper regions of the lightly doped diffusion layers. The silicon substrate is subjected to a heat treatment to cause recovery of crystal structure of silicon and activation of the impurity doped whereby lightly-doped drain structures of source/drain regions are formed. Spontaneous silicon oxide films are removed from a surface of the gate electrode made of polysilicon and from surfaces of the impurity doped diffusion layers. Nickel is deposited on the silicon substrate by a sputtering method, wherein the silicon substrate is heated up and maintained at a first temperature in the range of 150° C. to 300° C. to form a nickel film extending over the field oxide film, the impurity doped diffusion layers, the side wall spacers and the gate electrode. The substrate is subjected to a vacuum annealing at a temperature equal to or near the first temperature to cause nickel to react only with silicon in the impurity doped diffusion layers and the gate electrode made of polysilicon without reacting with silicon in the field oxide film and the side wall spacers to thereby selectively form a film made of dinickel monosilicide only on the impurity doped diffusion layers and the gate electrode as well as form a nickel film on the field oxide film and the side wall spacers. The surface of the substrate is subjected to a wet etching to selectively remove only the nickel film from the field oxide film and the side wall spacers nickel so that the field oxide film and the side wall spacers are shown whilst the impurity doped diffusion layers and the gate electrode remain covered by the film made of dinickel monosilicide. The substrate is subjected to a heat treatment at a second temperature of about 450° C. to cause a phase transition from dinickel monosilicide into mononickel monosilicide whereby the dinickel monosilicide film is made into a mononickel monosilicide film.

It is preferable that the first temperature is 200° C. It is also preferable that the second temperature is 450° C. at which the substrate is subjected to a RTA process.

It is optionally available that the wet etching uses a liquid as an etchant containing a mixture of sulfuric acid and hydrogen peroxide.

If cobalt is deposited on the substrate at a high temperature which is capable of causing a phase transition from monocobalt monosilicide to monocobalt disilicide, cobalt deposited on the insulation region reacts with silicon contained in the insulation region. Once cobalt has reacted with silicon in the insulation region, it is difficult to remove cobalt by using the wet etching without etching the dicobalt monosilicide film or the monocobalt disilicide film over the silicon region. If the dicobalt monosilicide film or the monocobalt monosilicide film is etched by the wet etching having been made for the purpose of removing cobalt deposited on the insulation region and reacted with silicon in the insulation region, then the thickness of the dicobalt monosilicide film or the monocobalt monosilicide film is reduced. Even if the heat treatment is made to the substrate to cause a phase transition from dicobalt monosilicide or monocobalt monosilicide into monocobalt disilicide, the reduced thickness of the monocobalt disilicide film increases the sheet resistance. Such increase in sheet resistance of the monocobalt disilicide film is more remarkable if the silicon region is scaled down to not larger than 0.1 micrometers.

By contrast, according to the present invention, cobalt is deposited on the substrate at a temperature, for example, in the range of 200° C. to 500° C. to cause cobalt to react only with silicon in the silicon region without reacting with silicon in the insulation region. Subsequently, the vacuum annealing is made to form a dicobalt monosilicide film or a monocobalt monosilicide film. Further, a heat treatment is made to cause a phase transition from dicobalt monosilicide or monocobalt monosilicide to monocobalt disilicide whereby the dicobalt monosilicide film or the monocobalt monosilicide film is made into a monocobalt disilicide film.

In accordance with the above salicide processes, it is possible to selectively form the monocobalt disilicide film only on the silicon region without causing any reaction of cobalt with silicon in the insulation region.

The above dicobalt monosilicide or monocobalt monosilicide film once formed has uniform grains and small in size. If cobalt is deposited on the substrate at a temperature at which cobalt begins to react with silicon and subsequently subjected to a vacuum annealing at the same temperature, then grain cores are formed uniformly at a highest density in the dicobalt monosilicide film. This means the average distance between the grain cores are extremely close to each other. Since the grains can increase in size by a heat treatment until the grains are in contact with adjacent grains, the grains can not grow up largely. As a result, extremely small and uniform grains are formed in the dicobalt monosilicide film. According to the above preset invention, the grain size is not larger than 0.1 micrometers. Such extremely small and uniform grains remarkably reduces the resisitvity of the monocobalt disilicide film.

By contrast, if the heat treatment is made one time at a high temperature, for example, about 700° C., the reaction of cobalt with silicon in the silicon region is not uniformly caused whereby the grains largely vary in size and less extremely small grain is formed.

In order to obtain a remarkable reduction in sheet resistance of the monocobalt disilicide film, it is essential to reduce the size of grains in the monocobalt disilicide film since if the size of the silicon region on which the monocobalt disilicide is selectively formed is scaled down near to the grain size, it is likely that one grain extends over the silicon region. This remarkably increases the sheet resistance of the monocobalt disilicide film.

Further, there is a possibility of causing a cohesion of monocobalt disilicide by a later heat treatment, resulting in an increase in sheet resistance of the monocobalt disilicide film. In this case, if the grain size is large, the increase in sheet resistance of the monocobalt disilicide film is remarkable.

Cobalt can react with silicon in the silicon region at a lower temperature than cobalt can react with silicon in the insulation region made of silicon oxide or silicon nitride. By utilizing this fact, cobalt is deposited on the substrate at a temperature which is capable of causing cobalt to react with silicon in the silicon region without, however, reacting with silicon in the insulation region made of silicon oxide or silicon nitride. It is easy to remove by a wet etching unreacted cobalt from the surface of the insulation region made of silicon oxide or silicon nitride. This makes it possible to avoid any etching to the dicobalt monosilicide film or the monocobalt monosilicide film.

EMBODIMENTS

A first embodiment according to the present invention will be described, wherein there is provided a novel method for selectively forming a monocobalt disilicide film on a polysilicon gate and impurity doped diffusion silicon layers in fabricating a field effect transistor.

Figure 2A:
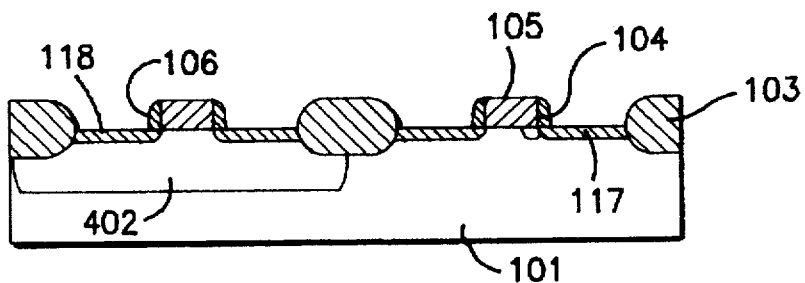
FIGS. 2A through 2D are fragmentary cross sectional elevation views illustrative of a novel method for fabricating a field effect transistor in a first embodiment according to the present invention.

With reference to FIG. 2A, a p-type silicon substrate 101 is prepared. An n-type well region 102 is selectively formed in an upper region of the p-type silicon substrate 101 by a selective ion-implantation. Field oxide films 103 are selectively formed on a surface of the substrate 101 by a local oxidation of silicon method wherein the field oxide films 103 have a thickness of 360 nanometers. As a result, active regions encompassed by the field oxide films 103 are defined. Gate oxide films 104 are selectively formed on the active regions, wherein the gate oxide films 104 have a thickness of 10 nanometers. A polysilicon film is formed, which extends over the entire surface of the substrate 101. The polysilicon film has a thickness of 150 nanometers. The polysilicon film is patterned by a photo-lithography and an ion-implantation to form gate electrodes 105. Subsequently, n-type and p-type lightly doped diffusion layers 117 and 118 are selectively formed by use of self-alignment technique. A silicon oxide film having a thickness of 70 nanometers is formed on an entire surface of the substrate 101. The silicon oxide film is then subjected to an etch back to thereby form side wall spacers 106 at opposite sides of each of the gate electrodes 105.

Figure 2B:
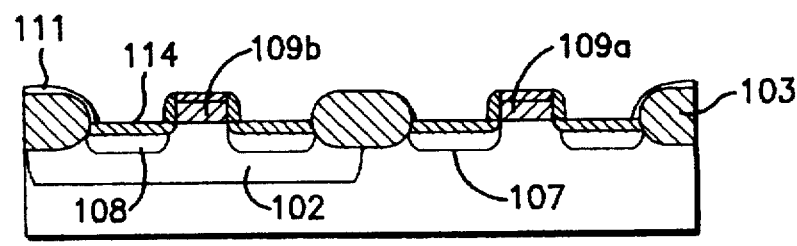

With reference to FIG. 2B, by use of a combination of photolithography with ion-implantation, n-type and p-type impurity diffusion layers are formed in upper regions of the n-type and p-type lightly doped diffusion layers 117 and 118 respectively. Further, n-type and p-type gate electrodes 109a and 109b are formed. The substrate 101 is hen subjected to a heat treatment at a temperature of 900° C. for 20 minutes in a nitrogen atmosphere to thereby cause recovery of silicon crystal structure and activation of the impurity doped. As a result, source/drain regions 107 and 108 having lightly-doped drain structures are formed.

Spontaneous silicon oxide films formed on the polysilicon gate electrodes 109a and 109b as well as on the n-type and p-type source/drain diffusion regions 107 and 108 are removed therefrom by use of a diluted fluorine acid so that surfaces of the gate electrodes 109a and 109b as well as surfaces of the n-type and p-type source/drain diffusion regions 107 and 108 are shown. A cobalt film 111 having a thickness of 10 nanometers is formed on an entire surface of the substrate 101 by a sputtering method wherein the substrate 101 is heated and maintained at a temperature of 450° C. The substrate 101 is then subjected to a vacuum annealing for 5 minutes whereby, on an interface between the cobalt film 111 and the n-type and p-type source/drain diffusion regions 107 and 108 and the polysilicon gate electrodes 109a and 109b, a dicobalt monosilicide film 114 is formed, which has a thickness of 15 nanometers.

Figure 2C:
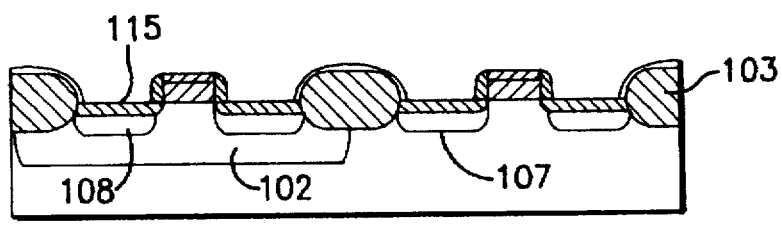

With reference to FIG. 2C, the substrate 101 is then subjected to an RTA treatment at a temperature of 800° C. for 30 seconds in a nitrogen atmosphere to cause a phase transition from dicobalt monosilicide into monocobalt monosilicide whereby the dicobalt monosilicide film 114 is made into a monocobalt monosilicide film 115 having a thickness of 20 nanometers.

Figure 2D:
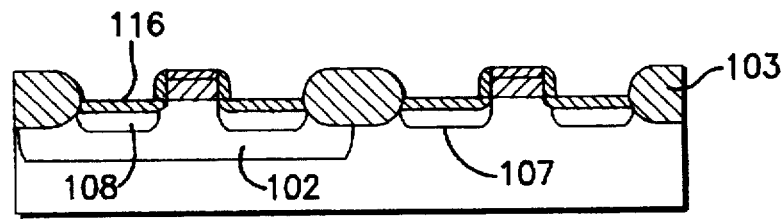

With reference to FIG. 2D, a surface of the substrate 101 is then subjected to a wet etching wherein an etchant is used, which comprises a liquid of mixture of a sulfuric acid with hydrogen peroxide to selectively remove unreacted cobalt. The substrate 101 is further subjected to a heat treatment of RTA at a high temperature of 800° C. for ten seconds to cause a phase transition of monocobalt monosilicide into monocobalt disilicide whereby the monocobalt monosilicide film is thus made into a monocobalt disilicide film 116 having a thickness of 35 nanometers. As a result, the monocobalt disilicide films 116 are selectively formed on the polysilicon gate electrodes 109a and 109b wherein the width of the monocobalt disilicide films 116 is 0.2 micrometers and the monocobalt disilicide films 116 have the same and extremely lower resistance. Further, the monocobalt disilicide films 116 are selectively formed on the n-type and p-type source/drain diffusion regions 107 and 108 wherein the width of the monocobalt disilicide films 116 is 0.5 micrometers and the monocobalt disilicide films 116 have the same and extremely lower resistance.

Figure 4A:
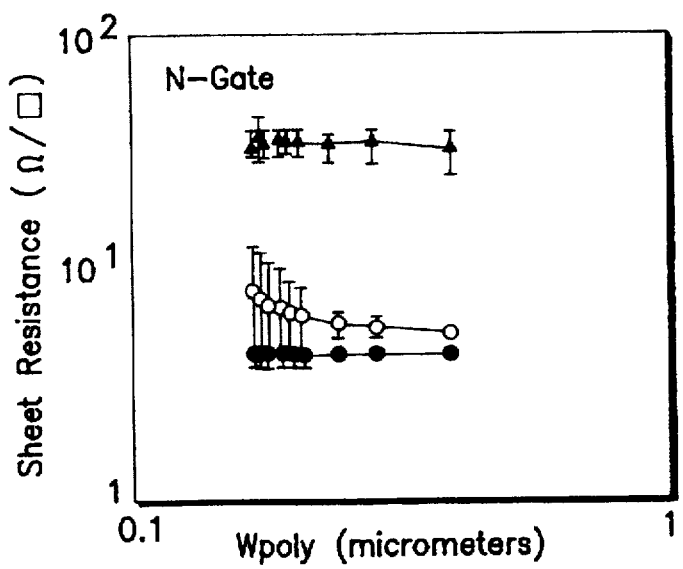
FIG. 4A illustrates variations in sheet resistance of the monocobalt disilicide film over width thereof, when the monocobalt disilicide film is formed on the n-type polysilicon gate electrode by three different sputtering processes.

FIG. 4A illustrates variations in sheet resistance of the monocobalt disilicide film over width thereof, when the monocobalt disilicide film is formed on the n-type polysilicon gate electrode by three different sputtering processes.

The mark ▼ represents the sheet resistance of the monocobalt disilicide film when a cobalt film has been deposited by a sputtering method at a room temperature, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere. The sheet resistance is high and variable and depends upon the conductivity type of the impurity doped in the polysilicon gate.

The mark ○ represents the sheet resistance of the monocobalt disilicide film when a cobalt film has been deposited by a sputtering method at a temperature of 450° C., followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance is remarkably reduced and remains low at not higher than $10\Omega/\square$ and is independent from the conductivity type of the impurity doped in the polysilicon gate.

The mark ● represents the sheet resistance of the monocobalt disilicide film when a cobalt film has been deposited by a sputtering method at a temperature of 450° C. and subsequent subjected to a vacuum annealing for 5 minutes, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance represented by the mark ● is much more remarkably reduced and remains lower than those represented by the mark ○ at not higher than $5\Omega/\square$ with almost no variation and is independent from the conductivity type of the impurity doped in the polysilicon gate.

Figure 4B:
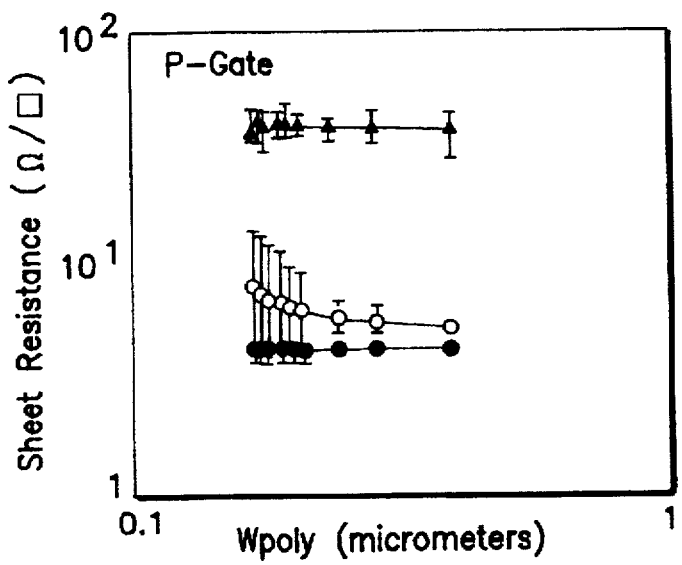
FIG. 4B illustrates variations in sheet resistance of the monocobalt disilicide film over width thereof, when the monocobalt disilicide film is formed on the p-type polysilicon gate electrode by three different sputtering processes.

FIG. 4B illustrates variations in sheet resistance of the monocobalt disilicide film over width thereof, when the monocobalt disilicide film is formed on the p-type polysilicon gate electrode by three different sputtering processes.

The mark ▼ represents the sheet resistance of the monocobalt disilicide film when a cobalt film has been deposited by a sputtering method at a room temperature, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere. The sheet resistance is high and variable and depends upon the conductivity type of the impurity doped in the polysilicon gate.

The mark ○ represents the sheet resistance of the monocobalt disilicide film when a cobalt film has been deposited by a sputtering method at a temperature of 450° C., followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance is remarkably reduced and remains low at not higher than $10\Omega/\square$ and is independent from the conductivity type of the impurity doped in the polysilicon gate.

The mark ● represents the sheet resistance of the monocobalt disilicide film when a cobalt film has been deposited by a sputtering method at a temperature of 450° C. and subsequent subjected to a vacuum annealing for 5 minutes, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance represented by the mark ● is much more remarkably reduced and remains lower than those represented by the mark ○ at not higher than $5\Omega/\square$ with almost no variation and is independent from the conductivity type of the impurity doped in the polysilicon gate.

Figure 5A:
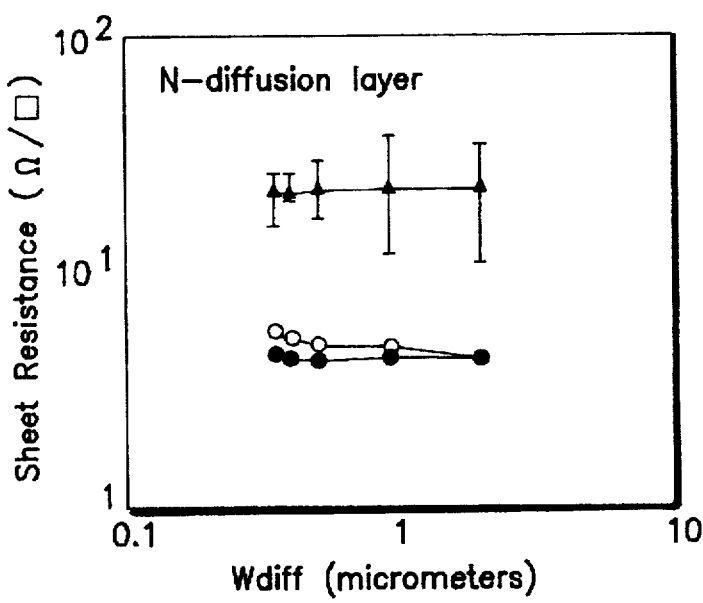
FIG. 5A illustrates variations in sheet resistance of the monocobalt disilicide film over width thereof, when the monocobalt disilicide film is formed on the n-type diffusion silicon layer by three different sputtering processes.

FIG. 5A illustrates variations in sheet resistance of the monocobalt disilicide film over width thereof, when the monocobalt disilicide film is formed on the n-type diffusion silicon layer by three different sputtering processes.

The mark ▼ represents the sheet resistance of the monocobalt disilicide film when a cobalt film has been deposited by a sputtering method at a room temperature, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere. The sheet resistance is high and variable and depends upon the conductivity type of the impurity doped in the polysilicon gate.

The mark ○ represents the sheet resistance of the monocobalt disilicide film when a cobalt film has been deposited by a sputtering method at a temperature of 450° C., followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance is remarkably reduced and remains low at not higher than $10\Omega/\square$ and is independent from the conductivity type of the impurity doped in the polysilicon gate.

The mark ● represents the sheet resistance of the monocobalt disilicide film when a cobalt film has been deposited by a sputtering method at a temperature of 450° C. and subsequent subjected to a vacuum annealing for 5 minutes, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance represented by the mark ● is much more remarkably reduced and remains lower than those represented by the mark ○ at not higher than $5\Omega/\square$ with almost no variation and is independent from the conductivity type of the impurity doped in the polysilicon gate.

Figure 5B:
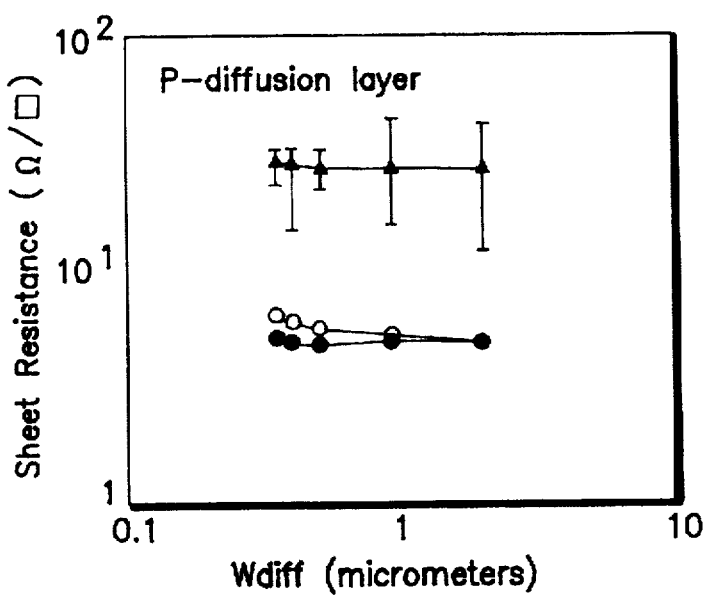
FIG. 5B illustrates variations in sheet resistance of the monocobalt disilicide film over width thereof, when the monocobalt disilicide film is formed on the diffusion silicon layer by three different sputtering processes.

FIG. 5B illustrates variations in sheet resistance of the monocobalt disilicide film over width thereof, when the monocobalt disilicide film is formed on the diffusion silicon layer by three different sputtering processes.

The mark ▼ represents the sheet resistance of the monocobalt disilicide film when a cobalt film has been deposited by a sputtering method at a room temperature, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere. The sheet resistance is high and variable and depends upon the conductivity type of the impurity doped in the polysilicon gate.

The mark ○ represents the sheet resistance of the monocobalt disilicide film when a cobalt film has been deposited by a sputtering method at a temperature of 450° C., followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance is remarkably reduced and remains low at not higher than 10Ω/□ and is independent from the conductivity type of the impurity doped in the polysilicon gate.

The mark ● represents the sheet resistance of the monocobalt disilicide film when a cobalt film has been deposited by a sputtering method at a temperature of 450° C. and subsequent subjected to a vacuum annealing for 5 minutes, followed by an RTA annealing at a temperature of 500° C. for 30 seconds in a nitrogen atmosphere and subsequent wet etching for removal of unreacted cobalt before an RTA at a temperature of 800° C. for 10 seconds in a nitrogen atmosphere in accordance with the present invention. The sheet resistance represented by the mark ● is much more remarkably reduced and remains lower than those represented by the mark ○ at not higher than 5Ω/□ with almost no variation and is independent from the conductivity type of the impurity doped in the polysilicon gate.

A second embodiment according to the present invention will be described, wherein there is provided another novel method for selectively forming a mononickel disilicide film on a polysilicon gate and impurity doped diffusion silicon layers in fabricating a field effect transistor.

Figure 3A:
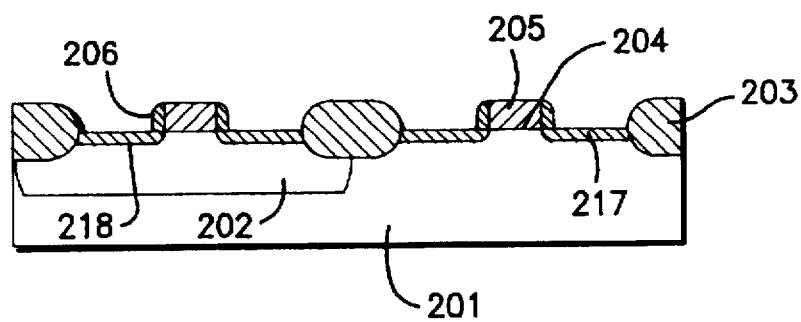
FIGS. 3A through 3C are fragmentary cross sectional elevation views illustrative of a novel method for fabricating a field effect transistor in a second embodiment according to the present invention.

With reference to FIG. 3A, a p-type silicon substrate 201 is prepared. An n-type well region 202 is selectively formed in an upper region of the p-type silicon substrate 201 by a selective ion-implantation. Field oxide films 203 are selectively formed on a surface of the substrate 201 by a local oxidation of silicon method wherein the filed oxide films 203 have a thickness of 360 nanometers. As a result, active regions encompassed by the filed oxide films 203 are defined. Gate oxide films 204 are selectively formed on the active regions, wherein the gate oxide films 204 have a thickness of 10 nanometers. A polysilicon film is formed, which extends over entire surface of the substrate 201. The polysilicon film has a thickness of 150 nanometers. The polysilicon film is patterned by a photo-lithography and an ion-implantation to form gate electrodes 202. Subsequently, n-type and p-type lightly doped diffusion layers 217 and 218 are selectively formed by use of a self-alignment technique. A silicon oxide film having a thickness of 70 nanometers is formed on an entire surface of the substrate 201. The silicon oxide film is then subjected to an etch back to thereby form side wall spacers 206 at opposite sides of each of the gate electrodes 202.

Figure 3B:
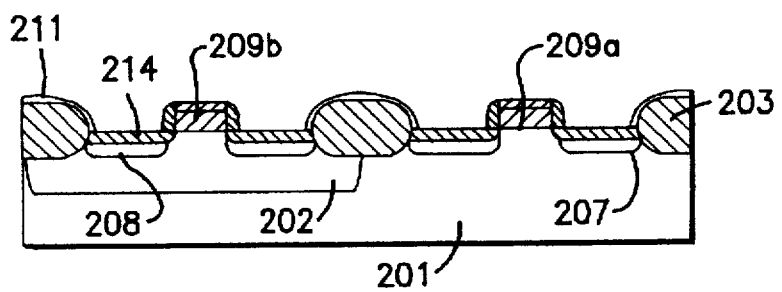

With reference to FIG. 3B, by use of a combination of photolithography with ion-implantation, n-type and p-type impurity diffusion layers are formed in upper regions of the n-type and p-type lightly doped diffusion layers 217 and 218 respectively. Further, n-type and p-type gate electrodes 209a and 209b are formed. The substrate 201 is then subjected to a heat treatment at a temperature of 900° C. for 20 minutes in a nitrogen atmosphere to thereby cause recovery of silicon crystal structure and activation of the impurity doped. As a result, source/drain regions 207 and 208 having lightly-doped drain structures are formed.

Spontaneous silicon oxide films formed on the polysilicon gate electrodes 209a and 209b as well as on the n-type and p-type source/drain diffusion regions 207 and 208 are removed therefrom by use of a diluted fluorine acid so that surfaces of the gate electrodes 209a and 209b as well as surfaces of the n-type and p-type source/drain diffusion regions 207 and 208 are shown. A nickel film 211 having a thickness of 20 nanometers is formed on an entire surface of the substrate 201 by a sputtering method wherein the substrate 201 is heated and maintained at a temperature of 200° C. The substrate 201 is then subjected to a vacuum annealing for 5 minutes whereby, on an interface between the nickel film 211 and the n-type and p-type source/drain diffusion regions 207 and 208 and the polysilicon gate electrodes 209a and 209b, a dinickel monosilicide film 214 is formed, which has a thickness of 30 nanometers.

Figure 3C:
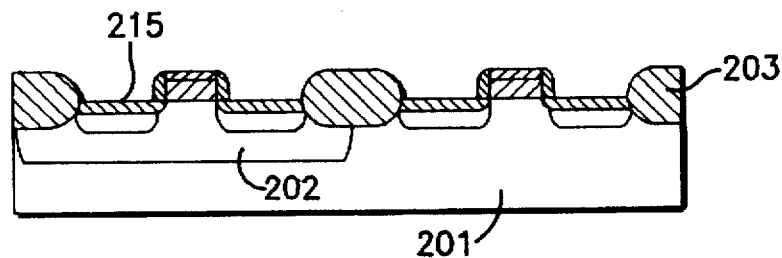

With reference to FIG. 3C, a surface of the substrate 201 is then subjected to a wet etching wherein an etchant is used, which comprises a liquid of mixture of a sulfuric acid with hydrogen peroxide to selectively remove unreacted nickel. The substrate 201 is further subjected to a heat treatment of RTA at a temperature of 450° C. for 30 seconds to cause a phase transition of dinickel monosilicide into mononickel monosilicide whereby the dinickel monosilicide film is thus made into a mononickel monosilicide film 215 having a thickness of 45 nanometers. As a result, the mononickel monosilicide films 215 are selectively formed on the polysilicon gate electrodes 209a and 209b wherein the width of the mononickel disilicide films 116 is 0.2 micrometers and the mononickel monosilicide films 215 have the same and extremely lower resistance. Further, the mononickel monosilicide films 215 are selectively formed on the n-type and p-type source/drain diffusion regions 207 and 208 wherein the width of the mononickel monosilicide films 215 is 0.5 micrometers and the mononickel disilicide films 116 have the same and extremely lower resistance.

The sheet resistance of the mononickel monosilicide film 215 on the n-type impurity diffusion silicon layer is 4.3Ω/□ and also the sheet resistance of the mononickel monosilicide film 215 on the p-type impurity diffusion silicon layer is 4.4Ω/□. Further, the sheet resistance of the mononickel monosilicide film 215 on the n-type polysilicon gate is 4.2Ω/□ and also the sheet resistance of the mononickel monosilicide film 215 on the polysilicon gate is 4.0Ω/□. The sheet resistance is remarkable reduced and remains low not higher than 0.5Ω/□ with almost no variation.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the invention.

What is claimed is:

1. A method of selectively forming a monocobalt disilicide film on a substrate having a surface including both an insulation region containing silicon and a silicon region, said method comprising the steps of:

depositing cobalt on said substrate, wherein said substrate is heated up and maintained at a first temperature, in the range of 200° C. through 500° C., thereby causing cobalt deposited on said silicon region to react with silicon in said silicon region and preventing cobalt deposited on said insulation region from reacting with silicon in said insulation region, and forming by silicidation reaction only on said silicon region one selected from the group consisting of dicobalt monosilicide and monocobalt monosilicide, while only cobalt unreacted with silicon remains deposited on said insulation region;

subjecting said substrate to a wet etching process for selective removal of cobalt unreacted with silicon thereby exposing said insulation region, while said silicon region remains covered by said one selected from the group consisting of dicobalt monosilicide and monocobalt monosilicide; and subjecting said substrate to a heat treatment at a second temperature which is higher than said first temperature thereby causing a phase transition from dicobalt monosilicide or monocobalt monosilicide into monocobalt disilicide so as to form a monocobalt disilicide film on said silicon region except on said insulation region.

2. The method as claimed in claim 1, further comprising the step of subjecting said substrate to a vacuum annealing at a temperature equal to or near said first temperature until all parts of cobalt deposited on said silicon region exhibits a silicidation reaction with silicon in said silicon region, while cobalt deposited on said insulation region exhibits no silicidation reaction.

3. The method as claimed in claim 1, wherein said first temperature is a temperature at which cobalt begins to react with silicon.

4. The method as claimed in claim 3, wherein said first temperature is in the range of 350° C. through 400° C.

5. The method as claimed in claim 1, wherein said second temperature is in the range of 500° C. through 800° C.

6. The method as claimed in claim 5, wherein said second temperature is 800° C. at which said substrate is subjected to a RTA process.

7. The method as claimed in claim 1, further comprising the step of:

following said second step and provided said film is made of dicobalt monosilicide, subjecting said substrate to an additional heat treatment in a nitrogen atmosphere at a third temperature which is higher than said first temperature and lower than said second temperature to cause a phase transition from dicobalt monosilicide into monocobalt monosilicide, whereby said dicobalt monosilicide film is converted into a monocobalt monosilicide film.

8. The method as claimed in claim 7, wherein said third temperature is about 500° C. at which said substrate is subjected to a RTA process.

9. The method as claimed in claim 1, wherein said wet etching process uses a liquid etchant containing a mixture of sulfuric acid and hydrogen peroxide.

10. The method as claimed in claim 1, further comprising the steps of:

following said second step and provided said film is made of dicobalt monosilicide, subjecting said substrate to an additional heat treatment in a nitrogen atmosphere at a third temperature which is higher than said first temperature and lower than said second temperature to cause a phase transition from dicobalt monosilicide into monocobalt monosilicide whereby said dicobalt monosilicide film is converted into a monocobalt monosilicide film; and subjecting said surface of said substrate to a wet etching step to selectively remove only cobalt unreacted with silicon so that said insulation region is exposed, while said silicon region remains covered by said film made of one selected from the group consisting of dicobalt monosilicide and monocobalt monosilicide.

11. The method as claimed in claim 10, wherein said third temperature is about 500° C. at which said substrate is subjected to a RTA process.

12. The method as claimed in claim 10, wherein said wet etching step uses a liquid etchant containing a mixture of sulfuric acid and hydrogen peroxide.

13. The method as claimed in claim 1, wherein said monocobalt disilicide film has grains whose size is not larger than 0.1 micrometers.

14. The method as claimed in claim 1, wherein said insulation region comprises a silicon oxide region.

15. The method as claimed in claim 1, wherein said insulation region comprises a silicon nitride region.

16. The method as claimed in claim 1, wherein cobalt is deposited on said substrate by a sputtering method.

17. A method of selectively forming a monocobalt disilicide film on a substrate having a surface including both an insulation region containing silicon and a polysilicon region, said method comprising the steps of:

depositing cobalt on said substrate, wherein said substrate is heated up and maintained at a first temperature in the range of 200° C. through 500° C., thereby causing cobalt deposited on said polysilicon region to react with silicon in said polysilicon region and preventing cobalt deposited on said insulation region from reacting with silicon in said insulation region, and forming by silicidation reaction only on said polysilicon region one selected from the group consisting of dicobalt monosilicide and monocobalt monosilicide, while only cobalt unreacted with silicon remains deposited on said insulation region;

subjecting said substrate to a wet etching process for selective removal of cobalt unreacted with silicon thereby exposing said insulation region, while said polysilicon region remains covered by said one selected from the group consisting of dicobalt monosilicide and monocobalt monosilicide; and subjecting said substrate to a heat treatment at a second temperature which is higher than said first temperature and thereby causing a phase transition from dicobalt monosilicide or monocobalt monosilicide into monocobalt disilicide so as to form a monocobalt disilicide film on said polysilicon region except on said insulation region.

18. The method as claimed in claim 17, further comprising the step of subjecting said substrate to a vacuum annealing at a temperature equal to or near said first temperature until all parts of cobalt deposited on said polysilicon region exhibit a silicidation reaction with silicon in said polysilicon region, while cobalt deposited on said insulation region exhibits no silicidation reaction.

19. The method as claimed in claim 17, wherein said first temperature is a temperature at which cobalt begins to react with silicon.

20. The method as claimed in claim 19, wherein said first temperature is in the range of 350° C. through 400° C.

21. The method as claimed in claim 17, wherein said second temperature is in the range of 500° C. through 800° C.

22. The method as claimed in claim 21, wherein said second temperature is 800° C. at which said substrate is subjected to a RTA process.

23. The method as claimed in claim 17, further comprising the step of:

following said second step and provided said film is made of dicobalt monosilicide, subjecting said substrate to an additional heat treatment in a nitrogen atmosphere at a third temperature which is higher than said first temperature and lower than said second temperature to cause a phase transition from dicobalt monosilicide into monocobalt monosilicide whereby said dicobalt monosilicide film is converted into a monocobalt monosilicide film.

24. The method as claimed in claim 23, wherein said third temperature is about 500° C. at which said substrate is subjected to a RTA process.

25. The method as claimed in claim 17, wherein said wet etching process uses a liquid etchant containing a mixture of sulfuric acid and hydrogen peroxide.

26. The method as claimed in claim 17, further comprising the steps of:

following said second step and provided said film is made of dicobalt monosilicide, subjecting said substrate to an additional heat treatment in a nitrogen atmosphere at a third temperature which is higher than said first temperature and lower than said second temperature to cause a phase transition from dicobalt monosilicide into monocobalt monosilicide whereby said dicobalt monosilicide film is converted into a monocobalt monosilicide film; and subjecting said surface of said substrate to a wet etching step to selectively remove only cobalt unreacted with silicon so that said insulation region is exposed, while said polysilicon region remains covered by said film made of one selected from the group consisting of dicobalt monosilicide and monocobalt monosilicide.

27. The method as claimed in claim 26, wherein said third temperature is about 500° C. at which said substrate is subjected to a RTA process.

28. The method as claimed in claim 26, wherein said wet etching step uses a liquid as an etchant containing a mixture of sulfuric acid and hydrogen peroxide.

29. The method as claimed in claim 17, wherein said monocobalt disilicide film has grains whose size is not larger than 0.1 micrometers.

30. The method as claimed in claim 17, wherein said insulation region comprises a silicon oxide region.

31. The method as claimed in claim 17, wherein said insulation region comprises a silicon nitride region.

32. The method as claimed in claim 17, wherein cobalt is deposited on said substrate by a sputtering method.

33. A method of selectively forming a mononickel monosilicide film on a substrate having a surface including both an insulation region containing silicon and a silicon region, said method comprising the steps of:

depositing nickel on said substrate, wherein said substrate is heated up and maintained at a first temperature in the range of 150° C. through 300° C., thereby causing nickel deposited on said silicon region to react with silicon in said silicon region and preventing nickel deposited on said insulation region from reacting with silicon in said insulation region, forming by silicidation reaction only on said silicon region dinickel monosilicide, while only nickel unreacted with silicon remains deposited on said insulation region;

subjecting said substrate to a wet etching process for selective removal of nickel unreacted with silicon thereby exposing said insulation region, while said silicon region remains covered by dinickel monosilicide; and subjecting said substrate to a heat treatment at a second temperature which is higher than said first temperature thereby causing a phase transition from dinickel monosilicide into mononickel monosilicide so as to form a mononickel monosilicide film on said silicon region except on said insulation region.

34. The method as claimed in claim 33, further comprising the step of subjecting said substrate to a vacuum annealing at a temperature equal to or near said first temperature until all parts of nickel deposited on said silicon region show a silicidation reaction with silicon in said silicon region, while nickel deposited on said insulation region shows no silicidation reaction.

35. The method as claimed in claim 33, wherein said first temperature is a temperature at which nickel begins to react with silicon.

36. The method as claimed in claim 35, wherein said first temperature is 200° C.

37. The method as claimed in claim 33, wherein said second temperature is 450° C.

38. The method as claimed in claim 37, wherein said substrate is subjected to a RTA process.

39. The method as claimed in claim 33, wherein said wet etching process uses a liquid etchant containing a mixture of sulfuric acid and hydrogen peroxide.

40. The method as claimed in claim 33, wherein said insulation region comprises a silicon oxide region.

41. The method as claimed in claim 33, wherein said insulation region comprises a silicon nitride region.

42. The method as claimed in claim 33, wherein nickel is deposited on said substrate by a sputtering method.

43. A method for selectively forming a mononickel monosilicide film on a substrate having a surface including both an insulation region containing silicon and a polysilicon region, said method comprising the steps of:

depositing nickel on said substrate, wherein said substrate is heated up and maintained at a first temperature in the range of 150° C. through 300° C., thereby causing nickel deposited on said polysilicon region to react with silicon in said polysilicon region and preventing nickel deposited on said insulation region from reacting with silicon in said insulation region, and forming by silicidation reaction dinickel monosilicide only on said polysilicon region, while only nickel unreacted with silicon remains deposited on said insulation region;

subjecting said substrate to a wet etching process for selective removal of nickel unreacted with silicon thereby exposing said insulation region, while said polysilicon region remains covered by dinickel monosilicide; and subjecting said substrate to a heat treatment at a second temperature which is higher than said first temperature thereby causing a phase transition from dinickel monosilicide into mononickel monosilicide so as to form a mononickel monosilicide film on said polysilicon region except on said insulation region.

44. The method as claimed in claim 43, further comprising the step of subjecting said substrate to a vacuum annealing at a temperature equal to or near said first temperature until all parts of nickel deposited on said polysilicon region exhibit a silicidation reaction with silicon in said polysilicon region, while nickel deposited on said insulation region exhibits no silicidation reaction.

45. The method as claimed in claim 43, wherein said first temperature is a temperature at which nickel begins to react with silicon.

46. The method as claimed in claim 45, wherein said first temperature is 200° C.

47. The method as claimed in claim 43, wherein said second temperature is 450° C.

48. The method as claimed in claim 47, wherein said substrate is subjected to a RTA process.

49. The method as claimed in claim 43, wherein said wet etching process uses a liquid etchant containing a mixture of sulfuric acid and hydrogen peroxide.

50. The method as claimed in claim 43, wherein said insulation region comprises a silicon oxide region.

51. The method as claimed in claim 43, wherein said insulation region comprises a silicon nitride region.

52. The method as claimed in claim 43, wherein nickel is deposited on said substrate by a sputtering method.

53. A method for fabricating a field effect transistor comprising the steps of:

selectively forming field oxide films on a surface of a silicon substrate to define an active region;

forming a gate oxide film on said active region;

forming a polysilicon film which is doped with an impurity on said gate oxide film;

forming a polysilicon gate electrode by patterning said polysilicon film;

selectively forming lightly doped diffusion silicon layers in an upper portion of said silicon substrate, provided said upper portion is not covered by said field oxide film and said polysilicon gate electrode;

forming silicon oxide side wall spacers at opposite sides of said polysilicon gate electrode;

subjecting surfaces of said lightly doped diffusion silicon layers to an ion-implantation with a self-alignment technique using said field oxide films, said polysilicon gate electrode and said silicon oxide side wall spacers as masks to form impurity doped diffusion silicon layers in upper regions of said lightly doped diffusion silicon layers;

subjecting said silicon substrate to a heat treatment to cause recovery of crystal structure of silicon and activation of said impurity doped whereby lightly-doped drain structures of source/drain regions are formed;

removing spontaneous silicon oxide films from a surface of said polysilicon gate electrode and from surfaces of said impurity doped diffusion silicon layers;

depositing cobalt on said silicon substrate by a sputtering method, wherein said silicon substrate is heated up and maintained at a first temperature in the range of 200° C. to 450° C., thereby causing cobalt deposited on said impurity doped diffusion silicon layers and said polysilicon gate electrode to react with silicon in said impurity doped diffusion silicon layers and said polysilicon gate electrode, and preventing cobalt deposited on said field oxide film and said silicon oxide side wall spacers from reacting with silicon in said field oxide film and said silicon oxide side wall spacers, forming by silicidation reaction dicobalt monosilicide only on said impurity doped diffusion silicon layers and said polysilicon gate electrode, while only cobalt unreacted with silicon remains deposited on said field oxide film and said silicon oxide side wall spacers;

subjecting said substrate to a vacuum annealing at a temperature equal to or near said first temperature until all parts of cobalt deposited on said impurity doped diffusion silicon layers and said polysilicon gate electrode exhibit a silicidation reaction with silicon in said impurity doped diffusion silicon layers and said polysilicon gate electrode, while cobalt deposited on said field oxide film and said silicon oxide side wall spacers exhibit no silicidation reaction;

subjecting said substrate to a heat treatment in a nitrogen atmosphere at a second temperature of about 500° C. to cause a phase transition from dicobalt monosilicide into monocobalt monosilicide and prevent cobalt deposited on said field oxide film and said silicon oxide side wall spacers from reacting with silicon in said field oxide film and said silicon oxide side wall spacers;

subjecting said surface of said substrate to a wet etching to selectively remove only cobalt unreacted with silicon so that said field oxide film and said silicon oxide side wall spacers are exposed, while said impurity doped diffusion silicon layers and said polysilicon gate electrode remain covered by monocobalt monosilicide; and subjecting said substrate to a heat treatment at a third temperature of not less than 650° C. to cause a phase transition from monocobalt monosilicide into monocobalt disilicide to thereby selectively form a monocobalt disilicide film only on said impurity doped diffusion silicon layers and said polysilicon gate electrode except on said field oxide film and said silicon oxide side wall spacers.

54. The method as claimed in claim 53, wherein said first temperature is 450° C.

55. The method as claimed in claim 53, wherein said third temperature is 800° C. at which said substrate is subjected to a RTA process.

56. The method as claimed in claim 53, wherein said second temperature is about 500° C. at which said substrate is subjected to a RTA process.

57. The method as claimed in claim 53, wherein said wet etching uses a liquid etchant containing a mixture of sulfuric acid and hydrogen peroxide.

58. A method for fabricating a field effect transistor comprising the steps of:

selectively forming field oxide films on a surface of a silicon substrate to define an active region;

forming a gate oxide film on said active region;

forming a polysilicon film which is doped with an impurity on said gate oxide film;

forming a polysilicon gate electrode by patterning said polysilicon film;

selectively forming lightly doped diffusion silicon layers in an upper portion of said silicon substrate, provided said upper portion is not covered by said field oxide film and said polysilicon gate electrode;

forming silicon oxide side wall spacers at opposite sides of said polysilicon gate electrode;

subjecting surfaces of said lightly doped diffusion layers to an ion-implantation with a self-alignment technique using said field oxide films, said polysilicon gate electrode and said silicon oxide side wall spacers as masks to form impurity doped diffusion silicon layers in upper regions of said lightly doped diffusion silicon layers;

subjecting said silicon substrate to a heat treatment to cause recovery of crystal structure of silicon and activation of said impurity doped whereby lightly-doped drain structures of source/drain regions are formed;

removing spontaneous silicon oxide films from a surface of said polysilicon gate electrode and from surfaces of said impurity doped diffusion silicon layers;

depositing nickel on said silicon substrate by a sputtering method, wherein said silicon substrate is heated up and maintained at a first temperature in the range of 150° C. to 300° C., thereby causing nickel deposited on said impurity doped diffusion silicon layers and said polysilicon gate electrode to react with silicon in said impurity doped diffusion silicon layers and said polysilicon gate electrode, and preventing nickel deposited on said field oxide film and said silicon oxide side wall spacers from reacting with silicon in said field oxide film and said silicon oxide side wall spacers, forming by silicidation reaction dinickel monosilicide only on said impurity doped diffusion silicon layers and said polysilicon gate electrode, while only nickel unreacted with silicon remains deposited on said field oxide film and said silicon oxide side wall spacers;

subjecting said substrate to a vacuum annealing at a temperature equal to or near said first temperature until all parts of nickel deposited on said impurity doped diffusion silicon layers and said polysilicon gate electrode exhibit a silicidation reaction with silicon in said impurity doped diffusion silicon layers and said polysilicon gate electrode, while nickel deposited on said field oxide film and said silicon oxide side wall spacers exhibits no silicidation reaction;

subjecting said surface of said substrate to a wet etching to selectively remove only nickel unreacted with silicon so that said field oxide film and said silicon oxide side wall spacers are exposed, while said impurity doped diffusion silicon layers and said polysilicon gate electrode remain covered by dinickel monosilicide; and subject said substrate to a heat treatment at a second temperature of about 450° C. to thereby selectively form a mononickel monosilicide film only on said impurity doped diffusion silicon layers and said polysilicon gate electrode except on said field oxide film and said silicon oxide side wall spacers.

59. The method as claimed in claim 58, wherein said first temperature is 200° C.

60. The method as claimed in claim 58, wherein said second temperature is 450° C. at which said substrate is subjected to a RTA process.

61. The method as claimed in claim 58, wherein said wet etching uses a liquid etchant containing a mixture of sulfuric acid and hydrogen peroxide.

* * * * *